United States Patent
Park et al.

(10) Patent No.: US 10,358,565 B2
(45) Date of Patent: *Jul. 23, 2019

(54) UV-CURABLE INK COMPOSITION, METHOD FOR PRODUCING BEZEL PATTERN OF DISPLAY SUBSTRATE USING SAME, AND BEZEL PATTERN PRODUCED THEREBY

(71) Applicant: LG CHEM, LTD., Seoul (KR)

(72) Inventors: Sung-Eun Park, Daejeon (KR); Yong-Sung Goo, Daejeon (KR); Seung-A Back, Daejeon (KR); Joon-Hyung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 29 days.

This patent is subject to a terminal disclaimer.

(21) Appl. No.: 15/514,419

(22) PCT Filed: Sep. 30, 2015

(86) PCT No.: PCT/KR2015/010341
§ 371 (c)(1),
(2) Date: Mar. 24, 2017

(87) PCT Pub. No.: WO2016/048115
PCT Pub. Date: Mar. 31, 2016

(65) Prior Publication Data
US 2017/0275480 A1    Sep. 28, 2017

(30) Foreign Application Priority Data

Sep. 26, 2014  (KR) .................. 10-2014-0129417
Sep. 30, 2015  (KR) .................. 10-2015-0138094

(51) Int. Cl.
| | | |
|---|---|---|
| *C09D 11/101* | (2014.01) | |
| *B41M 7/00* | (2006.01) | |
| *C09D 11/03* | (2014.01) | |
| *C09D 11/102* | (2014.01) | |
| *C09D 11/36* | (2014.01) | |
| *C09D 11/38* | (2014.01) | |
| *B41F 17/00* | (2006.01) | |
| *C09D 11/037* | (2014.01) | |
| *C09D 11/324* | (2014.01) | |
| *G09F 9/00* | (2006.01) | |
| *C08F 2/48* | (2006.01) | |
| *B41J 11/00* | (2006.01) | |
| *H05K 1/09* | (2006.01) | |
| *H05K 3/12* | (2006.01) | |
| *C09D 11/00* | (2014.01) | |
| *C09D 171/00* | (2006.01) | |

(52) U.S. Cl.
CPC .......... *C09D 11/101* (2013.01); *B41F 17/006* (2013.01); *B41J 11/002* (2013.01); *B41M 7/00* (2013.01); *B41M 7/009* (2013.01); *C08F 2/48* (2013.01); *C09D 11/00* (2013.01); *C09D 11/03* (2013.01); *C09D 11/037* (2013.01); *C09D 11/102* (2013.01); *C09D 11/324* (2013.01); *C09D 11/36* (2013.01); *C09D 11/38* (2013.01); *C09D 171/00* (2013.01); *G09F 9/00* (2013.01); *H05K 1/092* (2013.01); *H05K 3/12* (2013.01); *H05K 3/125* (2013.01); *H05K 3/1275* (2013.01); *H05K 2203/0534* (2013.01)

(58) Field of Classification Search
CPC ..... C09D 11/101; C09D 11/03; C09D 11/102; C09D 11/36; C09D 11/38; C09D 11/037; C09D 11/324; C09D 11/00; C09D 171/00; B41M 7/00; B41M 7/009; B41F 17/006; G09F 9/00; C08F 2/48; B41J 11/002; H05K 1/092; H05K 3/12; H05K 3/125; H05K 3/1275
USPC .......................................... 525/524
See application file for complete search history.

(56) References Cited

U.S. PATENT DOCUMENTS

| | | |
|---|---|---|
| 2010/0079568 A1 | 4/2010 | Miura et al. |
| 2014/0186592 A1 | 7/2014 | Jeon et al. |
| 2014/0342129 A1 | 11/2014 | Kim et al. |
| 2015/0125789 A1 | 5/2015 | Park et al. |

FOREIGN PATENT DOCUMENTS

| | | |
|---|---|---|
| JP | 2010-7000 A | 1/2010 |
| JP | 2010-13596 A | 1/2010 |
| JP | 2010-106254 A | 5/2010 |
| JP | 2013-147568 A | 8/2013 |
| JP | 2014-148580 A | 8/2014 |
| KR | 10-2013-0132322 A | 12/2013 |
| KR | 10-2014-0086584 A | 7/2014 |

(Continued)

OTHER PUBLICATIONS

Watanabe, JP 2010-013596 a machine translation in English, Jan. 21, 2010 (Year: 2010).*

(Continued)

*Primary Examiner* — David T Karst
(74) *Attorney, Agent, or Firm* — Dentons US LLP

(57) ABSTRACT

The present invention relates to a UV-curable ink composition, a method for producing a bezel pattern of a display substrate using same, and a bezel pattern produced thereby, the UV-curable ink composition comprising a colorant, an epoxy compound, an oxetane compound and a photopolymerization initiator, wherein the content ratio of the epoxy compound to the oxetane compound is 1:0.5-1:6.

37 Claims, No Drawings

(56) References Cited

FOREIGN PATENT DOCUMENTS

WO 2014/010884 A1 1/2014

OTHER PUBLICATIONS

Toagosei Co., LTD, "OXT technical report Aron Oxetane OXT-221", accessed Oct. 22, 2018 (Year: 2018).*
Toagosei Co., LTD, "OXT technical report Aron Oxetane OXT-212", accessed Oct. 22, 2018 (Year: 2018).*
Matweb, http://www.matweb.com/search/datasheet.aspx?matguid=e638ebde51ff4ac7b569b5263708d992&ckck=1, accessed Oct. 22, 2018 (Year: 2018).*

* cited by examiner

UV-CURABLE INK COMPOSITION, METHOD FOR PRODUCING BEZEL PATTERN OF DISPLAY SUBSTRATE USING SAME, AND BEZEL PATTERN PRODUCED THEREBY

TECHNICAL FIELD

This application is a National Stage Application of International Application No. PCT/KR2015/010341 filed on Sep. 30, 2015, which claims the benefit of Korean Patent Application No. 10-2014-0129417 filed on Sep. 26, 2014 and Korean Patent Application No. 10-2015-0138094 filed on Sep. 30, 2015, all of which are hereby incorporated by reference in their entirety for all purposes as if fully set forth herein.

The present invention relates to a UV-curable ink composition, a method for producing a bezel pattern of a display substrate using the same, and a bezel pattern produced thereby.

BACKGROUND ART

Recently, in a display device, a method for directly printing a bezel shading pattern on a substrate has been used instead of using a separate bezel structure in order to achieve the weight reduction and thinning.

Korean Patent No. 10-1391225 discloses the technique of forming a bezel pattern using a photosensitive resin composition. However, conventional photosensitive resin compositions for forming a bezel pattern contain a large amount of a diluting agent in order to dilute high viscosity, and there is a problem that a pre-bake process is required at a high temperature before exposure. Furthermore, in the method for producing a display substrate in the related art, a photolithography method or a screen printing method is used in order to form a bezel pattern. But in the case of the photolithography method, there is a disadvantage in that the production costs for forming a pattern are expensive, and the process is complicated. In the case of the screen printing method, the thickness of a formed pattern due to high viscosity of a composition is increased to several tens of μm, and accordingly, there is a problem that a step difference occurs between the bezel layer and the substrate.

Therefore, there is a need for developing a method for forming a bezel pattern having a thin thickness and a soft taper and a sufficient light shielding property as compared with the conventional method of forming a bezel pattern

DISCLOSURE

Technical Problem

In order to solve the problems of the prior art, an object of the present invention is to provide an ultraviolet curable ink composition which has a low viscosity even though it has no diluent or small amount of it and can provide a bezel with a small taper angle and a thin film thickness at the time of forming a bezel pattern.

Technical Solution

In order to solve the above problems, the present invention provides a UV-curable ink composition comprising a colorant, an epoxy compound, an oxetane compound and a photopolymerization initiator wherein a content ratio of the epoxy compound to the oxetane compound is 1:0.5 to 1:6.

Further, the present invention provides a method for producing a bezel pattern for a display substrate, comprising: forming a bezel pattern on a substrate by using the UV-curable ink composition; and curing the bezel pattern.

In addition, the present invention provides a bezel pattern for a display substrate, which is formed on a substrate by curing the UV-curable ink composition.

Advantageous Effects

According to the present invention, it is possible to produce a bezel pattern which does not exhibit a short-circuit due to a large step difference and the deterioration in appearance quality according to the generation of bubbles and the release of the film by using a UV-curable ink composition which exhibits a small taper angle and a thin film thickness to form a bezel pattern when the composition is cured.

The bezel pattern manufacturing method of the present invention can produce a bezel pattern without a high temperature process by using an ultraviolet curable ink composition having a low viscosity and excellent curing sensitivity in spite of containing no diluent or a small amount thereof.

BEST MODE

Hereinafter, the present invention will be described in more detail.

The present invention provides a UV-curable ink composition comprising a colorant, an epoxy compound, an oxetane compound, and a photopolymerization initiator, wherein a content ratio of the epoxy compound to the oxetane compound is 1:0.5 to 1:6.

Further, the UV-curable ink composition of the present invention may further comprise one or more selected from the group consisting of a surfactant, an adhesion promoter, a diluent, and a photosensitizer.

In the UV-curable ink composition, a radical polymerizable resin and a cationic polymerizable resin may be usually used. The radical polymerizable resin is not suitable for curing of a thin film because of curing failure due to oxygen, and is not suitable for forming a bezel pattern because curing shrinkage is so large that adhesion to a glass base material is low. In contrast, the cationic polymerizable resin is advantageous in curing a thin film because the resin typically has low curing shrinkage and is slightly affected by oxygen.

The UV-curable ink composition used in the present invention comprises an epoxy compound as a cationic curing component. The epoxy compound may be specifically one or a mixture of two selected from a bisphenol type epoxy compound, a novolac type epoxy compound, a glycidyl ester type epoxy compound, a glycidyl amine type epoxy compound, a linear aliphatic epoxy compound, a biphenyl type epoxy compound, and an alicyclic epoxy compound.

The alicyclic epoxy compound may mean a compound comprising one or more epoxidized aliphatic ring groups.

In the alicyclic epoxy compound comprising an epoxidized aliphatic ring group, the epoxidized aliphatic ring group means an epoxy group bonded to an alicyclic ring, and it is possible to exemplify a functional group, such as, for example, a 3,4-epoxycyclopentyl group, a 3,4-epoxycyclohexyl group, a 3,4-epoxycyclopentylmethyl group, a 3,4-epoxycyclohexylmethyl group, a 2-(3,4-epoxycyclopentyl) ethyl group, a 2-(3,4-epoxycyclohexyl)ethyl group, a 3-(3, 4-epoxycyclopentyl)propyl group or a 3-(3,4- epoxycyclohexyl)propyl group. A hydrogen atom constituting the alicyclic ring may also be optionally substituted with a substituent such as an alkyl group. As the alicyclic epoxy compound, for example, a compound to be specifically exemplified below may be used, but not limited thereto.

For example, it is possible to use dicyclopentadiene dioxide, cyclohexene oxide, 4-vinyl-1,2-epoxy-4-vinyl cyclohexene, vinyl cyclohexene dioxide, limonene monoxide, limonene dioxide, (3,4-epoxycyclohexyl)methyl-3,4-epoxycyclohexane carboxylate, 3-vinylcyclohexene oxide, bis(2,3-epoxycyclopentyl)ether, bis(3,4-epoxycyclohexyl methyl)adipate, bis(3,4-epoxy-6-methylcyclohexyl methyl) adipate, (3,4-epoxycyclohexyl)methyl alcohol, (3,4-epoxy-6-methylcyclohexyl)methyl-3,4-epoxy-6-methylcyclohexane carboxylate, ethylene glycol bis(3,4-epoxycyclohexyl)ether, 3,4-epoxycyclohexene carboxylic acid ethylene glycol diester, (3,4-epoxycyclohexyl)ethyl trimethoxysilane, Celloxide 8000 manufactured by Daicel Corp., and the like.

The content of the epoxy compound may be preferably 5 to 60 wt %, and more preferably 10 to 30 wt %, with respect to a total weight of the UV-curable ink composition. When the content exceeds 60 wt %, the viscosity is increased, and when the content is less than 5 wt %, the sensitivity deteriorates.

The UV-curable ink composition comprises an oxetane compound as another cationic polymerizable monomer.

The oxetane compound is a compound having a 4-membered cyclic ether group in a molecular structure thereof, and may serve to lower the viscosity of the cationically cured ink composition, for example, to less than 50 cPs at 25° C.

Specifically, it is possible to use 3-ethyl-3-hydroxymethyl oxetane, 1,4-bis[(3-ethyl-3-oxetanyl)methoxymethyl]benzene, 3-ethyl-3-(phenoxymethyl)oxetane, di[(3-ethyl-3-oxetanyl)methyl]ether, 3-ethyl-3-(2-ethylhexyloxymethyl)oxetane, 3-ethyl-3-cyclohexyloxymethyl oxetane or phenol novolac oxetane, and the like. As the oxetane compound, it is possible to use, for example, 'ARON OXETANE OXT-101', 'ARON OXETANE OXT-121', 'ARON OXETANE OXT-211', 'ARON OXETANE OXT-221' or 'ARON OXETANE OXT-212', manufactured by Toagosei Co., Ltd., and the like. The oxetane compounds may be used either alone or in combination of two or more thereof.

The content of the oxetane compound may be preferably 15 to 80 wt %, and more preferably 40 to 60 wt %, with respect to the total weight of the UV-curable ink composition. When the content exceeds 80 wt %, the curing sensitivity is low, and when the content is less than 15 wt %, the viscosity is increased, and as a result, the coatability deteriorates.

Further, the oxetane compound of the present invention may be used while comprising an oxetane compound having one oxetane ring and an oxetane compound having two oxetane rings. When the oxetane compound having one oxetane ring and the oxetane compound having two oxetane rings are together used, there is an advantage in that the viscosity and the flexibility of the film may be adjusted. When two oxetane compounds are together used as described above, it is preferred to use the two oxetane compounds in a content range of the oxetane compound having one oxetane ring to the oxetane compound having two oxetane rings of 1:16 to 1:3.

Further, the present invention has a content ratio of the epoxy compound to the oxetane compound of 1:0.5 to 1:6. When the ratio of the epoxy compound and the oxetane compound exceeds 1:6, the coatability of the composition is excellent as the viscosity of the composition is low, but the curing sensitivity may deteriorate. When the ratio is less than 1:0.5, the coatability may deteriorate as the viscosity of the composition is high.

The ink composition of the present invention comprises a compound which produces a cationic species or a Bronsted acid by irradiation of UV rays as a cationic photopolymerization initiator, for example, an iodonium salt or a sulfonium salt, but not limited thereto.

The iodonium salt or sulfonium salt causes a curing reaction in which monomers having an unsaturated double bond contained in ink are reacted to form a polymer during the UV curing process to occur. A photosensitizer may also be used according to the polymerization efficiency.

As an example, the photopolymerization initiator may be a photopolymerization initiator having an anion represented by $SbF_6^-$, $AsF_6^-$, $BF_6^-$, $(C_6F_5)_4B^-$, $PF_6^-$ or $RfnF_{6-n}$, but is not limited thereto.

The photopolymerization initiator may be contained in an amount of preferably 1 to 15 wt %, and more preferably 2 to 10 wt %, with respect to the total weight of the UV-curable ink composition. When the content of the photopolymerization initiator is less than 1 wt %, the curing reaction is not sufficient, and when the content exceeds 15 wt %, the photopolymerization initiator is not all dissolved, or the viscosity is increased, and as a result, the coatability may deteriorate.

The ink composition may further comprise a diluent for improving the coating property by lowering the viscosity of the ink to increase the flowability.

Examples of the diluent comprise at least one selected from the group consisting of methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxypropanol, 2-methoxypropanol, 2-ethoxyethanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate, but are not necessarily limited thereto.

The content of the diluent is preferably 0 to 30% by weight, more preferably 0.1 to 20% by weight based on the total weight of the UV curable ink composition. If it is more than 30% by weight, the curing sensitivity is lowered.

The UV-curable ink composition comprises a colorant.

As the colorant, one or more pigments, dyes, or mixtures thereof may be used, and the colorant is not particularly limited as long as the colorant may express a color if necessary.

As an exemplary embodiment of the present invention, it is possible to use carbon black, graphite, metal oxides, an organic black pigment, and the like as a black pigment.

Examples of carbon black may comprise SEAST 5HIISAF-HS, SEAST KH, SEAST 3HHAF-HS, SEAST NH, SEAST 3M, SEAST 300HAF-LS, SEAST 116HMMAF-HS, SEAST 116MAF, SEAST FMFEF-HS, SEAST SOFEF, SEAST VGPF, SEAST SVHSRF-HS and SEAST SSRF (Tokai Carbon Co., Ltd.); DIAGRAM BLACK II, DIAGRAM BLACK N339, DIAGRAM BLACK SH, DIAGRAM BLACK H, DIAGRAM LH, DIAGRAM HA, DIAGRAM SF, DIAGRAM N550M, DIAGRAM M, DIAGRAM E, DIAGRAM G, DIAGRAM R, DIAGRAM N760M, DIAGRAM LR, #2700, #2600, #2400,

2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B (Mitsubishi Chemical Corp.); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 (Colombia Carbon Co., Ltd.) or mixtures thereof, and the like.

As the organic black pigment, aniline black, lactam black or perylene black series, and the like may be used, but the organic black pigment is not limited thereto. In the present invention, the UV-curable ink composition is cured by irradiation of UV rays (for example, 250 or 450 nm), more preferably UV rays with a long wavelength (for example, 360 to 410 nm), and thus has a certain level of optical density (OD). For this purpose, the content of the colorant may be preferably 1 to 15 wt %, and more preferably 3 to 10 wt %, with respect to the total weight of the UV-curable ink composition. When the content of the colorant is less than 1 wt %, a level of OD which is applicable to the bezel may not be exhibited, and when the content exceeds 15 wt %, an excessive amount of the colorant may not be dispersed in ink, and a precipitate may be formed.

When the content of the colorant is within the range, the OD may be maintained in a range of 0.05 to 2.5 per a film thickness of 1.0 µm.

The ultraviolet curable ink composition comprises a surfactant that lowers the surface tension of the ink composition to exhibit a small taper angle.

As a surfactant, commercially available products may be used, and for example, it is possible to use those selected from the group consisting of Megafack F-444, F-475, F-478, F-479, F-484, F-550, F-552, F-553, F-555, F-570, RS-75, which are manufactured by DaiNippon Ink & Chemicals (DIC), Inc., Surflon 5-111, S-112, S-113, S-121, S-131, S-132, S-141 and S-145, which are manufactured by Asahi Glass Co., Ltd., or Fluorad FC-93, FC-95, FC-98, FC-129, FC-135, FC-170C, FC-430 and FC-4430, which are manufactured by Sumitomo 3M, Co., Ltd., Zonyl FS-300, FSN, FSN-100 and FSO, which are manufactured by Dupont Co., BYK-306, BYK-310, BYK-320, BYK-330, BYK-331, BYK-333, BYK-342, BYK-350, BYK-354, BYK-355, BYK-356, BYK-358N, BYK-359, BYK-361N, BYK-381, BYK-370, BYK-371, BYK-378, BYK-388, BYK-392, BYK-394, BYK-399, BYK-3440, BYK-3441, BYKETOL-AQ, BYK-DYNWET 800, BYK-SILCLEAN 3700 and BYK-UV 3570, which are manufactured by BYK Chemie, and Rad 2100, Rad 2011, Glide 100, Glide 410, Glide 450, Flow 370 and Flow 425, which are manufactured by Tego company.

The surfactant is preferably contained in an amount of 0.1 to 5.0% by weight, more preferably 0.5 to 3.0% by weight based on the total weight of the UV curable ink composition. When the content of the surfactant is less than 0.1% by weight, the effect of lowering the surface tension of the composition is insufficient, resulting in coating failure when the composition is coated on the substrate. When the content exceeds 5.0% by weight, the surfactant is excessively used resulting in causing a problem that the compatibility and the defoaming property of the composition are rather reduced.

The UV-curable ink composition may further comprise a photosensitizer in order to complement the curability by the active energy ray having a long wavelength.

The photosensitizer may be one or more selected from the group consisting of anthracene-based compounds, such as anthracene, 9,10-dibutoxy anthracene, 9,10-dimethoxy anthracene, 9,10-diethoxy anthracene, and 2-ethyl-9,10-dimethoxy anthracene; benzophenone-based compounds, such as benzophenone, 4,4-bis(dimethylamino)benzophenone, 4,4-bis(diethylamino)benzophenone, 2,4,6-trimethylaminobenzophenone, methyl-o-benzoylbenzoate, 3,3-dimethyl-4-methoxybenzophenone, and 3,3,4,4-tetra(t-butylperoxycarbonyl)benzophenone; acetophenone; ketone-based compounds, such as dimethoxy acetophenone, diethoxy acetophenone, 2-hydroxy-2-methyl-1-phenylpropan-1-one, and propanone; perylene; fluorenone-based compounds, such as 9-fluorenone, 2-chloro-9-fluorenone, and 2-methyl-9-fluorenone; thioxanthone-based compounds, such as thioxanthone, 2,4-diethylthioxanthone, 2-chlorothioxanthone, 1-chloro-4-propyloxythioxanthone, isopropylthioxanthone (ITX) and diisopropylthioxanthone; xanthone-based compounds, such as xanthone and 2-methylxanthone; anthraquinone-based compounds, such as anthraquinone, 2-methyl anthraquinone, 2-ethyl anthraquinone, t-butyl anthraquinone and 2,6-dichloro-9,10-anthraquinone; acridine-based compounds, such as 9-phenylacridine, 1,7-bis(9-acridinyl)heptane, 1,5-bis(9-acridinyl)pentane and 1,3-bis(9-acridinyl) propane; dicarbonyl compounds, such as benzyl, 1,7,7-trimethyl-bicyclo[2,2,1]heptane-2,3-dione and 9,10-phenanthrenequinone; phosphine oxide-based compounds, such as 2,4,6-trimethylbenzoyl diphenylphosphine oxide and bis(2,6-dimethoxybenzoyl)-2,4,4-trimethylpentyl phosphine oxide; benzoate-based compounds, such as methyl-4-(dimethylamino)benzoate, ethyl-4-(dimethylamino)benzoate, and 2-n-butoxyethyl-4-(dimethylamino)benzoate; amino synergists, such as 2,5-bis(4-diethylaminobenzal)cyclopentanone, 2,6-bis(4-diethylaminobenzal)cyclohexanone and 2,6-bis(4-diethylaminobenzal)-4-methyl-cyclohexanone; coumarin-based compounds, such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H, 11H—Cl]-benzopyrano[6,7,8-ij]-quinolizin-11-one; chalcone compounds, such as 4-diethylaminochalcone and 4-azidobenzalacetphenone; 2-benzoylmethylene; and 3-methyl-b-naphthothiazoline.

The photosensitizer is contained in an amount of preferably 1 to 200 parts by weight, and more preferably 10 to 100 parts by weight, with respect to 100 parts by weight of the photopolymerization initiator. There are problems in that when the content is less than 1 part by weight, the synergistic action of curing sensitivity may not be expected at a desired wavelength, and when the content exceeds 200 parts by weight, the photosensitizer is not dissolved and the adhesive force of the pattern and the crosslinking density deteriorate.

The UV-curable ink composition may further comprise an adhesion promoter as an additive.

The film attached on the bezel pattern repeatedly shrinks and expands depending on the use conditions such as temperature and humidity, so that stress is imposed on the bezel pattern, and as a result, the film and the bezel may detach from the glass base material. When one or more silane-based compounds selected from the group consisting of alkoxy silane-based compounds, epoxy silane-based compounds, aminophenyl silane-based compounds, amino silane-based compounds, mercapto silane-based compounds, and vinyl silane-based compounds are used as an adhesion promoter in order to prevent the detachment, an excellent result may be exhibited.

Among them, epoxy silane-based compounds are more preferred as the adhesion promoter of the present invention.

The adhesion promoter is contained in an amount of preferably 0.1 to 15 wt %, and more preferably 2 to 10 wt %, with respect to the total weight of the ink composition. There are problems in that when the content is less than 0.1 wt %, the bezel pattern cannot be prevented from being peeled off from the glass base material, and when the content exceeds 15 wt %, the viscosity of the ink solution is increased, and the dispersibility is low.

The UV-curable ink composition used in the present invention spreads within a short period of time immediately after inkjet printing, and thus exhibits excellent coating film characteristics, and the composition is cured to exhibit excellent adhesive characteristics. Therefore, when the UV-curable ink composition is applied, it is preferred to dispose a UV-lamp right behind the inkjet head such that the ink composition may be cured simultaneously with the inkjet printing.

The dose for curing the UV-curable ink composition is 1 to 10,000 mJ/cm$^2$, preferably 80 to 2,000 mJ/cm$^2$.

The UV-curable ink composition is cured by absorbing radiation in a wavelength range of 250 nm to 450 nm, preferably 360 nm to 410 nm.

The UV-curable ink composition has a viscosity of 1 cP to 50 cP at 25° C., more preferably 3 cP to 45 cP at 25° C. as an example, and thus is suitable for the inkjet process.

The ultraviolet curable ink composition having the viscosity range described above has good discharge at the process temperature.

The process temperature means a temperature heated such that the viscosity of the curable ink composition can be reduced. The process temperature may be 10° C. to 100° C., preferably 20° C. to 70° C.

The ultraviolet curable ink composition has excellent adhesion to a glass substrate and coating properties.

Also, the bezel pattern formed according to the present invention with the ultraviolet curable ink composition is excellent in adhesion to the upper substrate.

The top portion of a bezel pattern formed by using the UV-curable ink composition is attached to a upper substrate through an adhesive layer for a upper substrate, and since the UV-curable ink composition exhibits excellent attaching force to an adhesive for a upper substrate, such as an acrylic adhesive, a styrene butadiene rubber-based adhesive, an epoxy adhesive, a polyvinyl alcohol-based adhesive, and a polyurethane-based adhesive, the adhesion between the bezel pattern and the upper substrate can be improved when the ultraviolet curable ink composition is used.

The method for producing a bezel pattern of a display substrate according to the present invention uses the UV-curable ink composition.

Specifically, the method for producing a bezel pattern of a display substrate according to the present invention comprises: a) forming a bezel pattern on a substrate by using the UV-curable ink composition; and b) curing the bezel pattern.

In addition, the method for producing a bezel pattern of a display substrate according to the present invention may further comprise cleaning and drying the substrate prior to a) the forming of the bezel pattern. The cleaning and drying is for selectively carrying out a surface treatment depending on the surface energy of the substrate in order to improve coating properties of the ink and remove stains caused by foreign substances.

Specifically, the surface treatment may be carried out by a treatment such as a wet surface treatment, a UV ozone treatment, and a normal pressure plasma treatment.

As the method for forming a bezel pattern on the substrate, it is possible to use a method selected from an inkjet printing using a UV-curable resin instead of photolithography and screen printing, a gravure coating, and a reverse offset coating. In order to applying the method, the ink composition of the present invention may have a viscosity of 1 cP to 50 cP, and preferably 3 cP to 45 cP.

In order to form a bezel pattern on a specific portion of the substrate by the aforementioned method, the ink composition having a low viscosity of 1 cP to 50 cP is applied at a height of 0.1 to 20 μm, and more specifically 0.5 to 5 μm. The applied composition is cured by exposure comprising UV rays, and as a result, a bezel pattern having a thin film thickness of 0.1 to 20 μm, and more specifically 0.5 to 5 μm may be manufactured.

In the present invention, examples of a light source for curing the UV-curable composition comprise a mercury vapor arc, a carbon arc, a Xe arc, an LED curing device, and the like, which emit a light with a wavelength of 250 nm to 450 nm, but are not limited thereto.

The bezel pattern has a taper angle of more than 0° and 30° or less and a thickness of 0.1 μm to 20 μm, which are measured after a curing treatment. Further, the taper angle may be preferably more than 0° and 10° or less. In addition, the thickness may be preferably 0.5 μm to 5 μm. The bezel pattern of the present invention has the aforementioned features, and thus may not exhibit a short-circuit due to a large step difference and deterioration in appearance quality due to generation of bubbles and release of the film.

The optical density of the bezel pattern may be 0.05 to 2.5 per a film thickness of 1.0 μm, and 0.1 to 1.0, if necessary. In this case, there is an advantage in that shielding characteristics due to the bezel pattern are excellent. When the optical density exceeds 2.5, the manufacture of ink and the inkjet process may be adversely affected because a required content of pigment to be introduced is very high, and it is possible to inhibit the UV-curable ink composition from being cured by radiation.

The present invention provides a bezel pattern of a display substrate, which is manufactured by the method. The bezel pattern in the present invention refers to a pattern formed at the edge portion of various devices such as a clock and a display device.

The bezel pattern has a taper angle of more than 0° and 30° or less and a thickness of 0.1 μm to 20 μm, which are measured after a curing treatment. Further, the taper angle may be preferably more than 0° and 10° or less. In addition, the thickness may be preferably 0.5 μm to 5 μm. The bezel pattern of the present invention has the aforementioned features, and thus may not exhibit a short-circuit due to a large step difference and deterioration in appearance quality due to generation of bubbles and release of the film.

The optical density of the bezel pattern may be 0.05 to 2.5 based on a film thickness of 1.0 μm, and 0.25 to 1.0, if necessary. In this case, there is an advantage in that shielding characteristics due to the bezel pattern are excellent. When the optical density exceeds 2.5, the manufacture of ink and the inkjet process may be adversely affected because a required content of pigment to be introduced is very high, and it is possible to inhibit the UV-curable ink composition from being cured by radiation.

Furthermore, the present invention provides a display substrate including the bezel pattern.

The display device may be a display device used in any one of a plasma display panel (PDP), a light emitting diode (LED), an organic light emitting diode (OLED), a liquid crystal display (LCD) device, a thin film transistor-liquid crystal display (LCD-TFT) device, and a cathode ray tube (CRT).

Mode for Invention

Hereinafter, the present invention will be described in detail with reference to the Examples. The following Examples are provided for describing the present invention, and the scope of the present invention includes the scope described in the following claims and the substitution and modification thereof, and is not limited to the scope of the Examples.

TABLE 1

| example | colorant A | epoxy B | oxetane C | photopolymerization initiator D | surfactant E | diluent G | photo-sensitizer H |
|---|---|---|---|---|---|---|---|
| 1 | A1: 5 | B1: 13 | C2: 76 | D1: 5 | E1: 1 | — | — |
| 2 | A1: 5 | B1: 18 | C2: 71 | D1: 5 | E1: 1 | — | — |
| 3 | A1: 4 | B1: 57 | C2: 33 | D1: 5 | E1: 1 | — | — |
| 4 | A1: 5 | B1: 40 | C2: 49 | D2: 5 | E1: 1 | — | — |
| 5 | A1: 5 | B1: 40 | C2: 49 | D3: 5 | E1: 1 | — | — |
| 6 | A1: 5 | B1: 40 | C2: 49 | D4: 5 | E1: 1 | — | — |
| 7 | A1: 5 | B1: 40 | C2: 49 | D5: 5 | E1: 1 | — | — |
| 8 | A1: 5 | B1: 20 B2: 10 | C3: 59 | D3: 5 | E1: 1 | — | — |
| 9 | A1: 5 | B3: 40 | C2: 49 | D3: 5 | E1: 1 | — | — |
| 10 | A1: 5 | B1: 20 B2: 10 | C2: 59 | D3: 5 | E2: 1 | — | — |
| 11 | A1: 5 | B1: 20 B2: 10 | C2: 59 | D3: 5 | E3: 1 | | — |
| 12 | A1: 5 | B1: 20 B2: 10 | C2: 59 | D3: 5 | E4: 1 | | — |
| 13 | A1: 5 | B2: 25 | C2: 49 | D3: 5 | E4: 1 | G1: 15 | — |
| 14 | A1: 5 | B1: 25 | C2: 49 | D3: 5 | E4: 1 | G1: 15 | — |
| 15 | A1: 5 | B1: 30.5 | C2: 58 | D4: 5 | E3: 1 | — | H1: 0.5 |
| 16 | A1: 5 | B1: 30.5 | C2: 58 | D1: 5 | E3: 1 | — | H1: 0.5 |
| 17 | A1: 5 | B1: 30.5 | C2: 58 | D3: 5 | E3: 1 | — | H2: 0.5 |
| 18 | A1: 5 | B1: 20 | C1: 10 C2: 59 | D1: 5 | E2: 1 | — | — |
| 19 | A1: 5 | B1: 20 | C3: 10 C2: 59 | D3: 5 | E2: 1 | — | — |
| 20 | A1: 5 | B1: 20 | C3: 5 C2: 64 | D5: 5 | E2: 1 | — | — |
| 21 | A1: 5 | B3: 15 | C1: 15 C2: 59 | D1: 5 | E3: 1 | — | — |
| 비교예 | | | | | | — | — |
| 1 | A1: 5 | B1: 10 | C2: 79 | D5: 5 | E2: 1 | — | — |
| 2 | A1: 5 | B1: 65 | C2: 24 | D3: 5 | E2: 1 | — | — |
| 3 | A1: 5 | B1: 12 | C2: 77 | D3: 5 | E2: 1 | — | — |
| 4 | A1: 5 | B1: 8 | C2: 81 | D3: 5 | E2: 1 | — | — |
| 5 | A1: 5 | B2: 40 | C2: 50 | D3: 5 | — | — | — |
| 6 | A1: 5 | B2: 40 | C2: 49 | D3: 5 | E5: 1 | — | — |
| 7 | A1: 5 | B2: 35 | C2: 19 | D1: 5 | E1: 1 | G1: 35 | — |
| 8 | A1: 5 | B3: 35 | C2: 19 | D1: 5 | E1: 1 | G1: 35 | — |
| 9 | A1: 5 | B1: 65 | C2: 24 | D1: 5 | E1: 1 | — | — |
| 10 | A1: 5 | B1: 65 | C2: 24 | D3: 5 | E1: 1 | — | — |
| 11 | A1: 5 | B1: 10 | C2: 79 | D4: 5 | E1: 1 | — | — |
| 12 | A1: 5 | B1: 15 | C3: 44 C2: 30 | D1: 5 | E3: 1 | — | — |
| 13 | A1: 5 | B3: 15 | C3: 44 C4: 30 | D1: 5 | E3: 1 | — | — |
| 14 | A1: 5 | B1: 15 | C1: 44 C4: 30 | D1: 5 | E1: 1 | — | — |
| 15 | A1: 35 | B1: 5 | C2: 19 | D1: 5 | E1: 1 | G1: 35 | — |
| 16 | A1: 0.1 | B1: 25 | C2: 68.9 | D1: 5 | E1: 1 | — | — |

A1: Carbon black
B1: Celloxide 2021P (Daicel Corp.)
B2: YD-128 (bisphenol A diglycidylether, Kukdo Chemical)
B3: Celloxide 3000 (Daicel Corp.)
C1: ARON OXETANE 101 (Toagosei Co., Ltd.)
C2: ARON OXETANE 221 (Toagosei Co., Ltd.)
C3: ARON OXETANE 212 (Toagosei Co., Ltd.)
C4: ARON OXETANE 121 (Toagosei Co., Ltd.)
D1: CPI-200K (San-Apro)
D2: Irgacure 290 (BASF)
D3: UV-694 (Tetrachem)

TABLE 1-continued

| example | colorant A | epoxy B | oxetane C | photopoly-merization initiator D | surfactant E | diluent G | photo-sensitizer H |
|---|---|---|---|---|---|---|---|

D4: Rhodorsil 2074 (Bluestar silicones)
D5: Irgacure 250 (BASF)
E1: BYK-330 (BYK chemie)
E2: BYK-3441 (BYK chemie)
E3: RS-75 (DIC)
E4: F-561 (DIC)
E5: F-472SF (DIC)
G1: propylene glycol monomethyl ether acetate
H1: 9,10-dibutoxyanthracene
H2: 2-isopropylthioxanthone Preparation Example 1

Manufacture of Bezel Pattern

The compositions prepared in Examples 1 to 21 and Comparative Examples 1 and 14 were coated on a cleaned LCD glass base material by the inkjet coating method to have a thickness of 2 μm after curing. Bezel patterns were formed by irradiating ultraviolet rays on the coating layer under the following conditions within 1 minute after the coating in order to prevent foreign substances from being attached and curing the compositions. As a UV ray irradiation device, a high-pressure mercury lamp was use and a UV ray of 1,000 mJ/cm$^2$ as a UVV reference light intensity was irradiated.

Preparation Example 2

Manufacture of Display Device Using Bezel Pattern

A bezel pattern was formed on the upper surface of the display panel (hereinafter, referred to as the panel) by the method in Preparation Example 1, and as an upper base material, an NRT polarization film manufactured by LG Chem., which used an acrylic adhesive layer, was attached thereto. After the attachment, the surroundings thereof were capped by a sealant in order to prevent moisture and foreign substance from being incorporated into the gap between the polarization film and the pattern.

Experimental Example 1

Viscosity

For the compositions prepared in Examples 1 to 21 and Comparative Examples 1 and 14, viscosities were measured. As a viscosity measurement apparatus, DV-III+ manufactured by Brookfield Industries, Inc. was used.

Experimental Example 2

Measurement of Curing Sensitivity and Taper Angle

In order to measure the curing sensitivity of the bezel pattern manufactured according to Preparation Example 1, latex gloves were worn at the time point when 5 minutes elapsed after the irradiation of UV rays, and then the state of the surface was confirmed by pressing the bezel pattern.
○: The bezel pattern was not sticky, and completely cured
Δ: The bezel pattern was cured, but was sticky
x: The bezel pattern was insufficiently cured, and as result, unreacted residues were spotted In addition, a cross-sectional SEM photograph of the bezel pattern was taken to measure the taper angle and the results are shown in Table 2 below.
○: Taper angle less than 10 degrees
Δ: Taper angle between 10 degrees and 30 degrees
x: Taper angle more than 30 degrees Experimental Example 3

Evaluation of OD of Bezel Pattern

The composition was coated on a general LCD glass substrate to a thickness of 1 μm according to Preparation Example 1, except that the spin coating was performed instead of the ink-jet coating, and OD was measured therefor using an X-rite OD measuring apparatus.

TABLE 2

| Example Conditions | Viscosity (cP) | Whether cured or not 5 minutes after UV irradiation, ○: tack-free Δ: tacky X: unreacted | Taper angle taper ○: <10° Δ: 10°~30° X: >30° | OD value /1 μm |
|---|---|---|---|---|
| 1 | 14 | ○ | ○ | 0.3 |
| 2 | 17 | ○ | ○ | 0.3 |
| 3 | 45 | ○ | ○ | 0.25 |
| 4 | 32 | ○ | ○ | 0.3 |
| 5 | 32 | ○ | ○ | 0.3 |
| 6 | 32 | ○ | ○ | 0.3 |
| 7 | 32 | ○ | ○ | 0.3 |
| 8 | 39 | Δ | ○ | 0.3 |
| 9 | 7 | ○ | ○ | 0.3 |
| 10 | 44 | ○ | ○ | 0.3 |
| 11 | 44 | ○ | ○ | 0.3 |
| 12 | 45 | ○ | ○ | 0.3 |
| 13 | 40 | ○ | ○ | 0.3 |
| 14 | 15 | ○ | ○ | 0.3 |
| 15 | 23 | ○ | ○ | 0.3 |
| 16 | 23 | ○ | ○ | 0.3 |
| 17 | 23 | ○ | ○ | 0.3 |
| 18 | 16 | ○ | ○ | 0.3 |
| 19 | 14 | ○ | ○ | 0.3 |
| 20 | 16 | ○ | ○ | 0.3 |
| 21 | 18 | ○ | ○ | 0.3 |
| 비교예 | | | | |
| 1 | 13 | Δ | ○ | 0.3 |
| 2 | 67 | ○ | ○ | 0.3 |
| 3 | 14 | Δ | ○ | 0.3 |
| 4 | 12 | Δ | ○ | 0.3 |
| 5 | 150 | ○ | X | 0.3 |
| 6 | 150 | ○ | Δ | 0.3 |
| 7 | 84 | X | ○ | 0.3 |

TABLE 2-continued

| Example Conditions | Viscosity (cP) | Whether cured or not 5 minutes after UV irradiation, ○: tack-free Δ: tacky X: unreacted | Taper angle taper ○: <10° Δ: 10°~30° X: >30° | OD value /1 μm |
|---|---|---|---|---|
| 8 | 4 | X | ○ | 0.3 |
| 9 | 63 | ○ | ○ | 0.3 |
| 10 | 63 | ○ | ○ | 0.3 |
| 11 | 13 | Δ | ○ | 0.3 |
| 12 | 11 | Δ | ○ | 0.3 |
| 13 | 15 | Δ | ○ | 0.3 |
| 14 | 15 | Δ | ○ | 0.3 |
| 15 | 46 | X | ○ | 2.6 |
| 16 | 15 | ○ | ○ | 0.04 |

From the results shown in the above Table 2, it can be seen that the curable ink compositions of Examples 1 to 21 according to the present invention, by using both epoxy compound and oxetane compound with no diluent or a diluent in an amount of less than 20%, achieve excellent curing sensitivity. Compared to the ink compositions of Examples 1 to 4, the compositions of Comparative Examples 1, 3 and 4, in which the epoxy content was low, had insufficient curing sensitivity, and the composition of Comparative Example 2 in which the epoxy content is excessive has a viscosity of 50 cp or more at room temperature, resulting in the poor coating property.

The ink compositions of Comparative Examples 5 and 6 had better curing sensitivity than the compositions of Comparative Examples 1 to 4. But they require a high process temperature of 70 degrees or more because they have a very high viscosity compared to the compositions of Examples 1 to 21, and showed poor taper angles due to improper selection of the surfactant.

The ink compositions of Comparative Examples 7 and 8 had poor viscosity and poor curing sensitivity due to excessive use of the diluent as compared to the ink compositions of Examples 8 and 9.

The ink compositions of Comparative Examples 9 and 10 had high viscosity, and the ink composition of Comparative Example 11 had insufficient curing sensitivity.

The compositions of Comparative Examples 12 to 14 had slightly better curing sensitivity than the compositions of Comparative Examples 1 to 4, but the curing sensitivity was insufficient as compared with the ink compositions of Examples.

The composition of Comparative Example 15 had an extremely poor curing sensitivity because of the excessive amount of the colorant, and was not cured only by UV exposure, requiring a post-baking process. On the other hand, the composition of Comparative Example 16 was excellent in curing sensitivity, but the shielding density of the cured product was low, so that sufficient hiding power could not be obtained.

The invention claimed is:

1. A UV-curable ink composition for forming a bezel pattern comprising a colorant, an epoxy compound, an oxetane compound, a photopolymerization initiator, and a surfactant,
wherein a content ratio of the epoxy compound to the oxetane compound is 1:3.45 to 1:6,
wherein the oxetane compound comprises an oxetane compound having one oxetane ring and an oxetane compound having two oxetane rings,
wherein a content ratio of the oxetane compound having one oxetane ring to the oxetane compound having two oxetane rings is 1:5.9 to 1:16, and
wherein the UV-curable ink composition has a taper angle of 0° to 10° after being cured.

2. The UV-curable ink composition of claim 1, further comprising one or more selected from the group consisting of an adhesion promoter, a diluent, and a photosensitizer.

3. The UV-curable composition of claim 2, wherein a content of the diluent is 0 to 30 wt % based on the total weight of the UV-curable ink composition.

4. The UV-curable composition of claim 2, wherein the photosensitizer is contained in an amount of 1 to 200 parts by weight based on 100 parts by weight of the photopolymerization initiator.

5. The UV-curable composition of claim 2, wherein the adhesion promoter is a epoxy silane-based compound.

6. The UV-curable composition of claim 2, wherein the adhesion promoter is contained in an amount of 0.1 to 15 wt % based on the total weight of the UV-curable ink composition.

7. The UV-curable composition of claim 1, wherein a content of the epoxy compound is 5 to 60 wt % with respect to the total weight of the UV-curable ink composition.

8. The UV-curable composition of claim 1, wherein a content of the oxetane compound is 15 to 80 wt % with respect to the total weight of the UV-curable ink composition.

9. The UV-curable composition of claim 1, wherein the photopolymerization initiator is an iodonium salt or a sulfonium salt.

10. The UV-curable composition of claim 1, wherein a content of the photopolymerization initiator is 1 to 15 wt % based on the total weight of the UV-curable ink composition.

11. The UV-curable composition of claim 1, wherein a content of the colorant is 1 to 15 wt % based on the total weight of the UV-curable ink composition.

12. The UV-curable composition of claim 1, wherein the surfactant is a silicone-based, fluorine-based or acrylic surfactant.

13. The UV-curable composition of claim 1, wherein a content of the surfactant is 0.1 to 5.0 wt % based on the total weight of the UV-curable ink composition.

14. The UV-curable composition of claim 1, wherein a dose for curing the UV-curable ink composition is 1 to 10,000 mJ/cm$^2$.

15. The UV-curable composition of claim 1, wherein the UV-curable ink composition has a viscosity of 1 cp to 50 cp at 25° C.

16. The UV-curable composition of claim 15, wherein the UV-curable ink composition has a viscosity of 3 cp to 45 cp at 25° C.

17. The UV-curable composition of claim 1, which the ultraviolet-curable ink composition is able to be cured by absorbing radiation in the wavelength range of 250 nm to 450 nm.

18. The UV-curable composition of claim 17, which the ultraviolet-curable ink composition is able to be cured by absorbing radiation in the wavelength range of 360 nm to 410 nm.

19. A method for producing a bezel pattern for a display substrate, comprising:
a) forming a bezel pattern on a substrate by using the UV-curable ink composition of claim 1; and
b) curing the bezel pattern.

20. The method of claim 19, further comprising cleaning and drying the substrate prior to a) the forming of the bezel pattern.

21. The method of claim 20, wherein the cleaning and drying of the substrate is carried out by one or more treatments selected from the group consisting of a wet surface treatment, a UV ozone treatment, and a normal pressure plasma treatment.

22. The method of claim 19, wherein the method of forming the bezel pattern on the substrate in Step a) is a method selected from an inkjet printing, a gravure coating, and a reverse offset coating.

23. The method of claim 19, wherein Step a) is carried out at a process temperature of 10° C. to 100° C.

24. The method of claim 23, wherein Step a) is carried out at a process temperature of 20° C. to 70° C.

25. The method of claim 19, wherein the bezel pattern in Step b) is cured by absorbing radiation in the wavelength range of 250 nm to 450.

26. The method of claim 25, wherein the bezel pattern in Step b) is cured by absorbing radiation in the wavelength range of 360 nm to 410.

27. The method of claim 19, wherein the bezel pattern has a thickness of 0.1 μm to 20 μm.

28. The method of claim 27, wherein the bezel pattern has a thickness of 0.5 μm to 5 μm.

29. The method of claim 19, wherein the bezel pattern has a taper angle of 0° to 30°.

30. The method of claim 29, wherein the bezel pattern has a taper angle of 0° to 10°.

31. The method of claim 19, wherein the bezel pattern has an OD value of 0.05 to 2.5 per a film thickness of 1.0 μm.

32. A bezel pattern for a display substrate, which is formed on a substrate by curing the UV-curable ink composition of claim 1.

33. The bezel pattern of claim 32, wherein the bezel pattern has a thickness of 0.1 μm to 20 μm.

34. The bezel pattern of claim 33, wherein the bezel pattern has a thickness of 0.5 μm to 5 μm.

35. The bezel pattern of claim 32, wherein the bezel pattern has a taper angle of 0° to 30°.

36. The bezel pattern of claim 35, wherein the bezel pattern has a taper angle of 0° to 10°.

37. The bezel pattern of claim 32, wherein the bezel pattern has an OD value of 0.05 to 2.5 per a film thickness of 1.0 μm.

* * * * *